March 31, 1970 KOJI SHIBUYA 3,504,197
GATE CONTROLLED SWITCH AND TRANSISTOR
RESPONSIVE TO UNIPOLAR INPUT PULSES
Filed Aug. 17, 1966

INVENTOR
KOJI SHIBUYA
BY
Hopgood & Calimafde
ATTORNEYS

United States Patent Office 3,504,197
Patented Mar. 31, 1970

3,504,197

GATE CONTROLLED SWITCH AND TRANSISTOR RESPONSIVE TO UNIPOLAR INPUT PULSES

Koji Shibuya, Tokyo, Japan, assignor to Nippon Electric Company, Limited, Tokyo, Japan, a corporation of Japan

Filed Aug. 17, 1966, Ser. No. 573,024
Claims priority, application Japan, Aug. 20, 1965, 40/50,832
Int. Cl. H03k *3/31*
U.S. Cl. 307—252 2 Claims

ABSTRACT OF THE DISCLOSURE

A semiconductor switching circuit is described wherein the circuit is placed in series with a load and DC power source to control the current through the load. A negative resistance switching element is employed, such as a gate controlled switch which requires opposite polarity control signa's to obtain on and off control of the element. The circuit provides the desired control with like polarity input signals applied to a transistor switch which is rendered conducting and nonconducting in respective correspondence with the element by use of a unidirectional current feedback network.

The present invention relates to a switching circuit which employs a negative resistance switching element of high conductivity, and more particularly to such an element having anode, cathode and control electrodes and in which the state of conduction between the anode and cathode can be controlled in response to a signal applied to the control electrode.

For purposes of simplicity and convenience, the negative resistance switching element referred to above will be hereinafter referred to as GCS (i.e. Gate Controlled Switching element).

The GCS is a semiconductor device which turns to the conductive state of low impedance in response to a positive current signal applied to its control electrode or gate and which in turn changes from the conductive state to the cut-off state of high impedance in response to a negative current signal applied to the control electrode. Because of such characteristics, the GCS can switch a DC circuit on or off in response to a pulse current signal, and hence may be widely used to replace the mechanical contacts in the conventional contact type relay circuit. The control characteristics of the GCS per se, however, have the disadvantages that a negative signal is required for a change from its conductive state to its cut-off state, that the amplitude of this negative signal is required to be of the order of approximately one-fifth of the load current, and that considerable higher power of the negative signal than that of the positive signal which is required to change it from the cut-off state to the conductive state must be applied to the control electrode. It is therefore impossible for the GCS alone to be switched on and off in response to such unipolar signals of small amplitude as ordinarily exist in the input of a transistor flip-flop circuit.

Accordingly, it is an object of this invention to provide a switching circuit in which a GCS having the above-mentioned characteristics can be switched on and off with very small unipolar signals.

One of the features of this invention is a substantially increased switching speed compared with that of the contact type relay.

Other features of the invention are improved wave shape of the load current and superior stability of operation.

Figure 1:
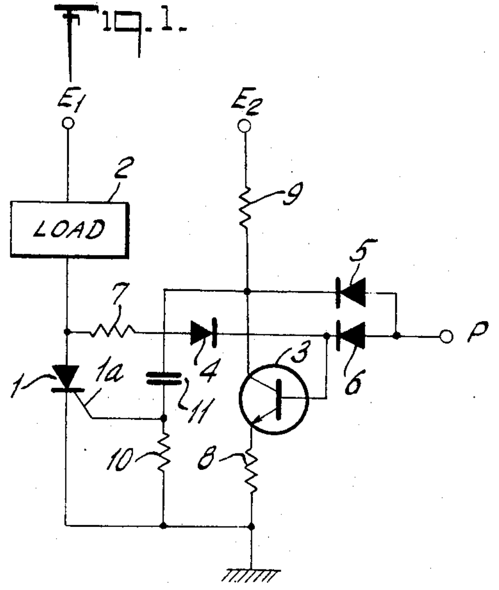
Figure 2:
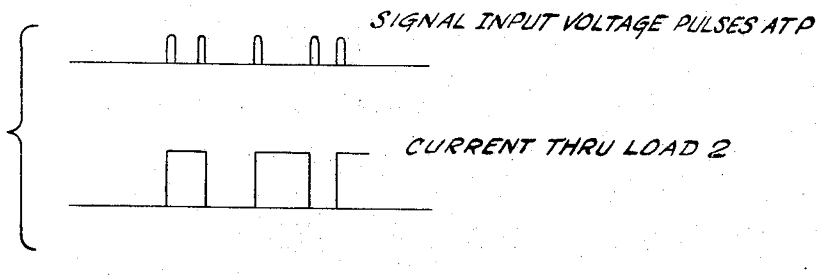

All of the objects, features and advantages of this invention and the manner of attaining them will become more apparent and the invention itself will be best understood by reference to the following description of the invention taken in conjunction with the accompanying drawing, in which:

FIG. 1 is a circuit diagram of a switching circuit in accordance with the present invention, and FIG. 2 shows wave shapes of the voltage and current in the circuit of FIG. 1 for explaining the operation thereof.

Referring now to FIG. 1, a circuit in accordance with the present invention includes a GCS 1 connected in series wih a load 2 to which a source $E_1$ for supplying a voltage to a main circuit is connected. Referring also to FIG. 2, so long as a pulse signal is not applied to the signal input terminal P, the GCS 1 is in a cut-off state, and hence the anode voltage is approximately equal to the supplied voltage, which in turn drives the transistor 3 to a saturated state by causing a small current to flow through a high resistance 7 and a diode 4 to the base of the transistor 3. The collector voltage of the transistor 3 has a relatively low value that is determined by the dividing resistors 8 and 9 and the voltage $E_2$ supplied to the control circuit.

If a pulse signal having a voltage exceeding the collector voltage of the transistor 3 is applied to the input terminal P, current is caused to flow through the diodes 5 and 6. The current through the diode 5 flows as positive current through a capacitor 11 into a resistor 10 and the control terminal or gate 1*a* of the GCS 1, while the current through the diode 6 does not affect the circuit operation at this stage. The positive current flowing into the control terminal 1*a* of the GCS 1 drives the switch from the cut-off state into the conductive state, closing the main circuit. When the GCS is turned on, the anode voltage thereof becomes approximately the ground potential, thus driving the transistor 3 to the cut-off state and raising the collector voltage up to the voltage $E_2$. During the transient period, the capacitor 11 is charged up to the voltage $E_2$ and a portion of the charging current is supplied to the gate of the GCS. Therefore, the values of the resistors 9 and 10 must be chosen so that the charging current does not then force the GCS into the conductive state.

If a pulse signal is applied to the input terminal P at the time when the GCS is in the conductive state, current flows only through the diode 6 because the diode 5 is inversely biased by the voltage $E_2$. The current through the diode 6 flows into the base of the transistor 3 and hence drives the transistor into the conductive state. As a result, the energy stored in the capacitor 11 is discharged through the transistor 3 and the resistor 8 to the resistor 10 and the GCS 1, causing the inverse biasing current to flow through the cathode and the gate of the GCS 1. Since this discharging current is the amplified replica of the input signal to the transistor 3, the negative current flowing through the gate of the GCS 1 may be of the order of several times as large as that of the input signal, with the result that the GCS is driven to a complete cut-off state to open the main circuit. After the GCS 1 arrives at the cut-off state, the anode potential again becomes high and the transistor becomes saturated. Thus, the entire circuit is restored to the initial state.

The above operation is repeated each time an input pulse signal is applied, and hence the load current is switched on and off in response to the input signals, all as seen in FIG. 2. The repitition frequency of the load current in such an operation is equal to one half of the input signal frequency. When the repetition frequency is significantly increased, the gate current becomes insufficient to force the GCS 1 into the cut-off state as the capacitor 11 is not sufficientliy charged during the transit period from the conductive state to the cut-off state of the GCS. Thus, although the smaller capacitance of the capacitor 11 is favorable for making the circuit responsive to the higher frequency, the capacitance can never be lowered to a value lower than a certain minimum value, in order that the necessary energy may be stored to bring the GCS to the cut-off state. According to our experiment, a repetition frequency of several kilocycles/second was obtained when the capacitor 11 had a capacity of 0.05 μf. and the GCS 1 had an average current capacity of 200 ma.

As described above, one embodiment of the present invention provides a switching circuit consisting of a simple circuit including a GCS, wherein a DC current can be switched on and off by relatively small unipolar pulse signals of relatively high repetition frequency; such circuit is advantageous for use in relay circuit applications and has the advantages resulting from elimination of mechanical contacts. Further advantages are improved load current wave shape and excellent stability of operation even for small signal pulse inputs.

While the foregoing description sets forth the principles of the invention in connection with specific apparatus, it is to be understood that the description is made only by way of example and not as a limitation of the scope of the invention as set forth in the objects thereof and in the accompanying claims.

What is claimed is:

1. In a semiconductor switching circuit placed in series with a load and a source of DC voltage for turning a semiconductor load current controlling element requiring opposite polarity control signals on and off with pulses of like polarity comprising a negative resistance switching element having a pair of power electrodes coupled in series with the load, the DC voltage source and ground, and a control electrode, said control electrode being capable of rendering the element conductive and nonconductive with control signals of respective opposite polarities relative to a power electrode, a resistor coupling the element control electrode to ground, a control transistor having a pair of power electrodes and a base control electrode, a capacitor coupling one of the control transistor power electrodes to the control electrode of the element, with said one transistor power electrode coupled to a second source of DC voltage for charging of said capacitor when said control transistor is cut-off, the other of the control transistor power electrodes being coupled to ground, a unidirectional feedback network coupling the element power electrode connected to the load to the base of the transistor to bias said transistor into cut-off when said element is conducting, and render said transistor conducting when said element is non-conducting, a pair of diodes having a like electrode connected to a common input terminal with one of the diodes coupling the common input terminal to the transistor base for rendering said transistor conductive in response to an input signal applied to the common input terminal and with the other diode coupling the common input terminal to said one transistor power electrode to render the element conductive through said capacitor in response to a like input signal applied to the common input terminal.

2. A switching circuit comprising a high conductivity negative resistance gate controlled switching element having an anode, a cathode and a control electrode, a transistor having an emitter, a collector and a base, a first terminal for receiving an operating potential, said switching element having its anode and cathode coupled between said first terminal and ground, a first diode connected between said anode and the base of said transistor, a series circuit comprising a second diode, a charge storage capacitor and a resistor connected between a signal input terminal and ground, with the capacitor between the diode and resistor, said control electrode being coupled to the junction between said capacitor and said resistor, a third diode connected between said signal input terminal and said base, means coupling the emitter of said transistor to ground, means for connecting the collecter of said transistor to another operating potential and to the junction of said capacitor and said second diode, said circuit having a first condition wherein said switching element is in the non-conductive state and said transistor is in the saturated state before the application of a given pulse to said signal input terminal, said transistor being maintained in said saturated state as a result of current flowing from said first terminal through said first diode and into said base, said circuit being driven into a second condition as a result of the application of a signal pulse to said signal input terminal, whereby a current flows from said latter terminal through said second diode, said capacitor and said resistor to drive said switching element from said non-conductive state into the conductive state, and to drive said transistor from said saturated state into the non-conductive state, and said circuit being returned to its first condition when a succeeding pulse is applied to said signal input terminal when said circuit is in said second condition, as a result of current flowing from said latter terminal through said third diode and into the base of said transistor.

References Cited

UNITED STATES PATENTS

| | | | |
|---|---|---|---|
| 3,176,159 | 3/1965 | Laishley | 307—252 |
| 3,207,962 | 9/1965 | Slusher | 307—305 X |
| 3,235,750 | 2/1966 | Anderson et al. | 307—288 X |
| 3,271,528 | 9/1966 | Vallese | 307—299 X |

JOHN S. HEYMAN, Primary Examiner

STANLEY D. MILLER, Assistant Examiner

U.S. Cl. X.R.

307—284, 305